United States Patent
Chin et al.

(10) Patent No.: US 8,850,097 B2
(45) Date of Patent: Sep. 30, 2014

(54) USB APPARATUS AND EMBEDDED SYSTEM INCORPORATING SAME

(75) Inventors: Yuan Fuat Chin, Singapore (SG); Kian Tiong Yeo, Singapore (SG); Song Gee Lim, Singapore (SG)

(73) Assignee: Verifone, Inc., San Jose, CA (US)

( * ) Notice: Subject to any disclaimer, the term of this patent is extended or adjusted under 35 U.S.C. 154(b) by 144 days.

(21) Appl. No.: 13/549,933

(22) Filed: Jul. 16, 2012

(65) Prior Publication Data
US 2014/0019666 A1    Jan. 16, 2014

(51) Int. Cl.
G06F 13/12    (2006.01)
G06F 13/40    (2006.01)
H03K 19/018   (2006.01)

(52) U.S. Cl.
CPC ...... *G06F 13/4068* (2013.01); *H03K 19/01806* (2013.01)
USPC ............... 710/305; 710/16; 710/300; 326/90; 327/56; 327/72; 327/80

(58) Field of Classification Search
USPC ........................................................ 710/313
See application file for complete search history.

(56) References Cited

U.S. PATENT DOCUMENTS

| | | | | |
|---|---|---|---|---|
| 6,301,628 B1 * | 10/2001 | Janssens | | 710/110 |
| 6,334,160 B1 * | 12/2001 | Emmert et al. | | 710/11 |
| 6,442,734 B1 * | 8/2002 | Hanson et al. | | 716/136 |
| 6,460,094 B1 * | 10/2002 | Hanson et al. | | 710/8 |
| 6,647,452 B1 * | 11/2003 | Sonoda | | 710/305 |
| 6,791,950 B2 * | 9/2004 | Wu | | 370/257 |
| 6,854,024 B2 * | 2/2005 | Barrenscheen et al. | | 710/19 |
| 6,895,447 B2 * | 5/2005 | Brewer et al. | | 710/11 |
| 7,096,435 B2 * | 8/2006 | Hanson et al. | | 716/137 |
| 7,383,371 B2 * | 6/2008 | Kasahara | | 710/305 |
| 7,441,062 B2 * | 10/2008 | Novotney et al. | | 710/303 |
| 7,464,206 B2 * | 12/2008 | Tsunekawa | | 710/105 |
| 7,576,559 B2 * | 8/2009 | Song et al. | | 326/30 |
| 7,583,105 B2 * | 9/2009 | Stopel et al. | | 326/85 |
| 7,779,171 B2 * | 8/2010 | Hanson et al. | | 710/16 |
| 7,836,239 B2 * | 11/2010 | Duval et al. | | 710/305 |
| 7,906,989 B2 * | 3/2011 | Payrat et al. | | 326/86 |
| 7,975,078 B2 * | 7/2011 | Hanson et al. | | 710/16 |
| 8,065,446 B2 * | 11/2011 | Kang et al. | | 710/16 |
| 8,112,556 B2 * | 2/2012 | Hanson et al. | | 710/16 |
| 8,183,886 B2 * | 5/2012 | Payrat et al. | | 326/86 |
| 8,296,474 B2 * | 10/2012 | Hanson et al. | | 710/16 |

(Continued)

FOREIGN PATENT DOCUMENTS

| | | |
|---|---|---|
| EP | 1 085 422 A2 | 3/2001 |
| EP | 2 180 410 A1 | 4/2010 |

OTHER PUBLICATIONS

"Universal serial Bus Specification" Revision 2.0, Apr. 27, 2000.

(Continued)

*Primary Examiner* — Ryan Stiglic
(74) *Attorney, Agent, or Firm* — Sughrue Mion, PLLC

(57) ABSTRACT

USB apparatus suitable for interconnection with a USB host having a D− bus coupled to ground via a pull-down resistance, the USB apparatus including a microcontroller having a first port and a second port, the first port being coupled via a resistance to a voltage source and a switch, operated by the microcontroller via the second port, selectably interconnecting the first port and the bus of the USB host.

19 Claims, 1 Drawing Sheet

(56) References Cited

U.S. PATENT DOCUMENTS

| | | | |
|---|---|---|---|
| 8,432,182 B2* | 4/2013 | Gaalaas et al. | 326/30 |
| 8,525,547 B2* | 9/2013 | Gaalaas et al. | 326/30 |
| 8,564,327 B2* | 10/2013 | Gaalaas et al. | 326/30 |
| 2002/0169915 A1* | 11/2002 | Wu | 710/305 |
| 2003/0074176 A1* | 4/2003 | Hanson et al. | 703/21 |
| 2003/0158990 A1 | 8/2003 | Allen et al. | |
| 2006/0015670 A1* | 1/2006 | Cinkler et al. | 710/302 |
| 2006/0075152 A1* | 4/2006 | Zhu | 710/15 |
| 2006/0218330 A1* | 9/2006 | Tsunekawa | 710/302 |
| 2007/0152738 A1* | 7/2007 | Stopel et al. | 327/538 |
| 2008/0215765 A1* | 9/2008 | Butler et al. | 710/15 |
| 2010/0070659 A1 | 3/2010 | Ma et al. | |
| 2010/0250820 A1* | 9/2010 | Gaalaas et al. | 710/305 |
| 2010/0257286 A1* | 10/2010 | Hanson et al. | 710/16 |
| 2011/0131345 A1* | 6/2011 | Payrat et al. | 710/16 |
| 2011/0231585 A1* | 9/2011 | Hanson et al. | 710/16 |
| 2012/0030381 A1 | 2/2012 | Singh et al. | |
| 2012/0124247 A1* | 5/2012 | Hanson et al. | 710/16 |
| 2012/0159008 A1* | 6/2012 | Park et al. | 710/15 |
| 2012/0205979 A1* | 8/2012 | Gaalaas et al. | 307/43 |
| 2012/0206164 A1* | 8/2012 | Gaalaas et al. | 326/30 |
| 2012/0254478 A1* | 10/2012 | Wada et al. | 710/15 |
| 2013/0326094 A1* | 12/2013 | Yu et al. | 710/15 |

OTHER PUBLICATIONS

"Universal serial Bus 3.0 Specification" (Including errata and ECNs through May 1, 2011), Revision 1.0, Jun. 6, 2011.
Extended European Search Report dated Sep. 26, 2013 which issued during the prosecution of Applicant's European App No. 13 17 5756.

* cited by examiner

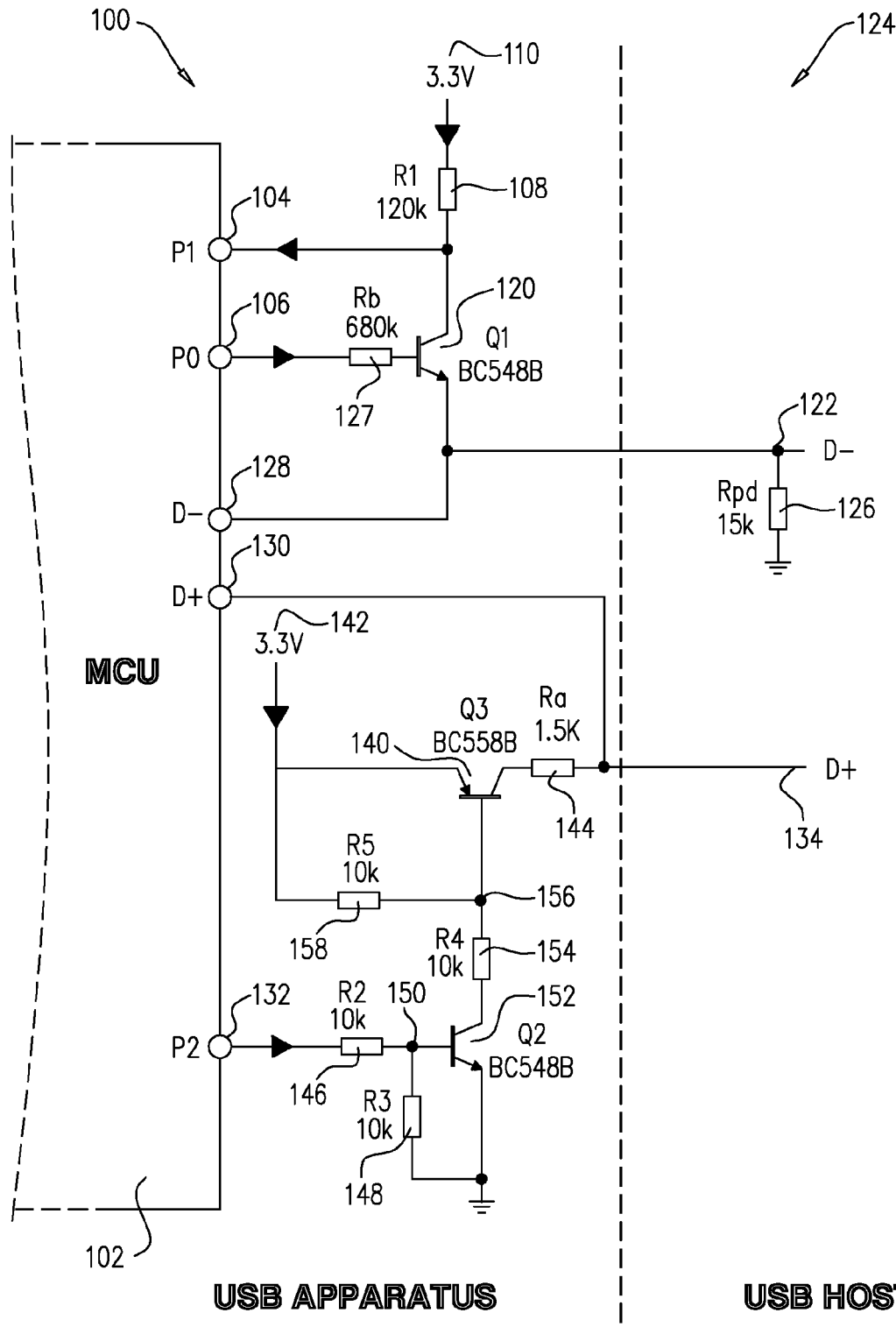

USB APPARATUS AND EMBEDDED SYSTEM INCORPORATING SAME

FIELD OF THE INVENTION

The present invention relates to USB apparatus generally.

BACKGROUND OF THE INVENTION

Various types of USB apparatus are known in the art.

SUMMARY OF THE INVENTION

The present invention seeks to provide an improved USB apparatus.

There is thus provided in accordance with a preferred embodiment of the present invention USB apparatus suitable for interconnection with a USB host having a D− bus coupled to ground via a pull-down resistance, the USB apparatus including a microcontroller having a first port and a second port, the first port being coupled via a resistance to a voltage source and a switch, operated by the microcontroller via the second port, selectably interconnecting the first port and the bus of the USB host, when the USB apparatus is connected to the USB host, the microcontroller, when operative in a connection detection mode, being operative to supply a predetermined voltage to the second port, thereby closing the switch and thereby interconnecting the first port and the bus of the USB host, when the USB apparatus is connected to the USB host and monitor a voltage at the first port, which voltage indicates connection of the USB apparatus with the USB host by virtue of a voltage drop at the first port produced by current flow from the first port via the switch and across the pull-down resistance to ground.

Preferably, the USB apparatus is a standalone device. Alternatively, the USB apparatus is incorporated into another apparatus.

In accordance with a preferred embodiment of the present invention the resistance to a voltage source coupled to the first port functions as a pull-up resistance. Additionally, the pull-up resistance is at least eight times greater than the pull-down resistance.

Preferably, the switch includes a transistor.

In accordance with a preferred embodiment of the present invention the microcontroller includes a D− bus and the D− bus of the microcontroller is galvanically coupled to the D− bus of the USB host. Additionally or alternatively, the USB host includes a D+ bus, the microcontroller includes a D+ bus and the D+ bus of the microcontroller is galvanically coupled to the D+ bus of the USB host.

Preferably, the switch of the USB apparatus is off when the USB apparatus is not connected to the USB host.

There is also provided in accordance with another preferred embodiment of the present invention a n embedded system including a USB host having a D− bus coupled to ground via a pull-down resistance and USB apparatus interconnected with the USB host, the USB apparatus including a microcontroller having a first port and a second port, the first port being coupled via a resistance to a voltage source and a switch, operated by the microcontroller via the second port, selectably interconnecting the first port and the bus of the USB host, when the USB apparatus is connected to the USB host, the microcontroller, when operative in a connection detection mode, being operative to supply a predetermined voltage to the second port, thereby closing the switch and thereby interconnecting the first port and the bus of the USB host, when the USB apparatus is connected to the USB host and monitor a voltage at the first port, which voltage indicates connection of the USB apparatus with the USB host by virtue of a voltage drop at the first port produced by current flow from the first port via the switch and across the pull-down resistance to ground.

Preferably, the USB host does not include a VBUS. Alternatively, a VBUS of the USB host is not connected.

In accordance with a preferred embodiment of the present invention the USB host does not employ a standard USB connector.

Preferably, the resistance to a voltage source coupled to the first port functions as a pull-up resistance. Additionally, the pull-up resistance is at least eight times greater than the pull-down resistance.

In accordance with a preferred embodiment of the present invention the switch includes a transistor.

Preferably, the microcontroller includes a D− bus and the D− bus of the microcontroller is galvanically coupled to the D− bus of the USB host. Additionally or alternatively, the USB host includes a D+ bus, the microcontroller includes a D+ bus and the D+ bus of the microcontroller is galvanically coupled to the D+ bus of the USB host.

In accordance with a preferred embodiment of the present invention the switch of the USB apparatus is off when the USB apparatus is not connected to the USB host.

BRIEF DESCRIPTION OF THE DRAWING

The present invention will be understood and appreciated more fully from the following detailed description, taken in conjunction with the drawing in which:

FIG. 1 is a simplified electrical circuit diagram illustrating a preferred embodiment of USB apparatus constructed and operative in accordance with a preferred embodiment of the present invention.

DETAILED DESCRIPTION OF A PREFERRED EMBODIMENT

Reference is now made to FIG. 1, which is a simplified electrical circuit diagram illustrating a preferred embodiment of USB apparatus 100 constructed and operative in accordance with a preferred embodiment of the present invention. The present invention is particularly useful for detecting the presence of a USB host by USB apparatus in an embedded system which does not include a VBUS. It overcomes a known problem of intermittent non-detection of a USB device by a USB host in a USB embedded system where the VBUS is not connected or used.

The present invention is applicable to embedded USB systems wherein a standard USB connector is not employed. For example, in a VERIFONE® VX805 Cordless Duet Point of Sale (POS) device, RJ45 connectors or Pogo pins are employed instead of a standard USB connector. Another example of an embedded USB system wherein a standard USB connector is not employed is where the host is a VERIFONE® a VX805 cordless Pinpad and the embedded system is a VX805 sprocket Base.

In accordance with a preferred embodiment of the present invention, there is provided an embedded USB system including the USB apparatus of the present invention, which system employs only the communication physical layer (D+/D−) and protocol.

As seen in FIG. 1, the USB apparatus 100 preferably includes a microcontroller 102 having first port 104 and a second port 106, the first port being coupled via a resistance 108 to a voltage source 110. A switch 120, operated by the microcontroller 102 via the second port 106, selectably interconnects the first port 104 and a D− bus 122 of a USB host 124, when the USB apparatus 100 is connected to the USB host 124. The D− bus 122 of USB host 124 is coupled across a pull down resistance 126 to ground.

In accordance with a preferred embodiment of the present invention, the microcontroller 102, when operative in a connection detection mode, is operative to:

supply a predetermined voltage to the second port 106, thereby closing switch 120 and thereby interconnecting the first port 104 and the D− bus 122 of the USB host 124, when the USB apparatus 100 is connected to the USB host 124; and monitor a voltage at the first port 104, which voltage indicates connection of the USB apparatus 100 with the USB host 124 by virtue of a voltage drop at the first port 104 produced by current flow from the first port 104 via switch 120 and across the pull-down resistance 126 to ground.

It is appreciated that the USB apparatus 100 may be a standalone device or alternatively may be incorporated or embedded in any other suitable apparatus.

In accordance with a preferred embodiment of the present invention, microcontroller 102 may be any suitable microcontroller and the first and second ports, respectively designated by reference numerals 104 and 106, are typically general purposed I/O (GPIO) ports designated P1 and P0. The present example assumes a pull-down resistance 126 of 15K ohm. In such a case, resistance 108 is typically 120K ohms. It is a particular feature of the invention that the resistance 108, which functions as a pull-up resistance, is at least eight times greater than the pull-down resistance 126 of the D− bus 122 of the host 124.

Switch 120 is typically a transistor, a preferred example of which is a BC548B, whose base is coupled to the second port 106 across a resistance 127 whose value is preferably 680K ohms, when the values of the pull-down resistance 126 and resistance 108 are as given above.

A D− bus 128 of the microcontroller 102 is galvanically coupled to the D− bus 122 of the host 124.

The USB apparatus 100 also preferably includes conventional circuitry which interconnects a D+ bus 130 and a port 132, designated P2, of the microcontroller 102 and a corresponding D+ bus 134 of the host 124. This conventional circuitry typically includes a galvanic connection between D+ bus 130 and D+ bus 134 as well as a switch 140, typically a transistor, such as a BC558B, which connects a voltage source 142, typically 3.3V, across a resistance 144, typically 1.5K ohm, to the D+ bus 134.

Port 132 (P2) of the microcontroller is typically coupled across a resistance 146, typically 10K ohm, and a resistance 148, typically 10K ohm, to ground. The junction 150 of resistances 146 and 148 is preferably connected to the base of a switch 152, typically a transistor, such as a BC548B, which, when the switch is a transistor, is operative to selectably interconnect the base of switch 140, across a resistance 154, typically 10K ohm, to ground. A junction 156 between the base of switch 140 and resistance 154 is coupled to voltage source 142 across a resistance 158, typically 10K ohm.

In accordance with the existing USB standards, a USB device detects if a USB host is connected to it. When the USB device detects that a VBUS is present, it senses a 1.5K ohm resistance on the D+ bus to indicate to the USB host that it is ready to start communication and the USB host employs the sensed 1.5K ohm resistance to confirm that a USB device is connected to its upstream port and is ready for communication.

In the context of the present invention, in contrast, where a VBUS is not connected or not present in the USB host 124, the USB host 124 lacks this 'handshaking' capability. At the instant when a USB physical connection is made, that connection is unreliable and the physical electrical contacts need time to stabilize. This makes communication precarious during this time. If the USB communication is interrupted at this time, the USB protocol in the USB host 124 assumes that no device is connected. No attempt at communication is normally made until a power cycle is initiated or a deliberate USB reset is raised.

In accordance with a preferred embodiment of the present invention, a determination of whether a USB host, such as host 124, is connected is made as follows:

Firmware in the microcontroller 102 configures port 106 as an output port and sets it to a logical high. If no USB host is connected, transistor switch 120 will not be closed because the emitter of transistor switch 120 is not coupled to the D− bus. Firmware in the microcontroller 102 configures port 104 as an input port and is connected to the collector of transistor switch 120 and is at a logical high, which is an indication to the firmware of the microcontroller that no host is connected. The firmware of the microcontroller 102 remains at a logical high as long as no host is connected.

When a USB host is connected, the pull-down resistance 126 of the host coupled to the D− bus 122 becomes galvanically connected to the emitter of transistor switch 120, thereby turning on the transistor switch 120 and connecting resistance 108 to pull-down resistance 126, thereby connecting a voltage divider to port 104. Since resistance 108 is preferably selected such that it is many times greater than the pull-down resistance 126, this produces a logical low at port 104, which is an indication to the firmware of the microcontroller 102 that a USB host is connected. The firmware of the microcontroller 102 turns off transistor switch 120 upon detecting the logical low at port 104 by outputting a logical low at port 106, thus completing the USB host detection functionality in accordance with a preferred embodiment of the present invention.

At this stage, once the USB apparatus 100 is ready for communication, the firmware of microcontroller 102 signals the USB host via the D+ bus by outputting a logical high at port 132 to start the conventional USB protocol.

When the USB apparatus 100 is disconnected from the USB host 124, the firmware of the microcontroller 102 detects the absence of USB Start of Frame (SOF) packets and in response to this detected absence, outputs a logical high at port 106 and monitors port 104 to detect a logical low.

It is a feature of the present invention that the USB apparatus 100 consumes very little power prior to detection of the USB host 124 since the transistor switch 120 is off until a host 124 is connected. Once a host is connected and the USB communication is established, the transistor switch 120 is again turned off.

It will be appreciated by persons skilled in the art that the present invention is not limited by what has been particularly shown and described hereinabove. Rather the present invention includes both combinations and subcombinations of various features described herein and improvements and variations which would occur to persons skilled in the art upon reading the foregoing description and which are not in the prior art.

The invention claimed is:

1. USB apparatus suitable for interconnection with a USB host having a D− bus coupled to ground via a pull-down resistance, said USB apparatus comprising:

a microcontroller having a first port and a second port, said first port being coupled via a resistance to a voltage source; and a switch, operated by said microcontroller via said second port, selectably interconnecting said first port and said D− bus of said USB host, when said USB apparatus is connected to said USB host, said microcontroller, when operative in a connection detection mode, being operative to:

supply a predetermined voltage to said second port, thereby closing said switch and thereby interconnecting said first port and said D− bus of said USB host, when said USB apparatus is connected to said USB host; and monitor a voltage at said first port, which voltage indicates connection of said USB apparatus with said USB host by virtue of a voltage drop at said first port produced by current flow from said first port via said switch and across said pull-down resistance to ground.

2. USB apparatus suitable for interconnection with a USB host according to claim 1 wherein said USB apparatus is a standalone device.

3. USB apparatus suitable for interconnection with a USB host according to claim 1 wherein said USB apparatus is incorporated into another apparatus.

4. USB apparatus suitable for interconnection with a USB host according to claim 1 wherein said resistance to a voltage source coupled to said first port functions as a pull-up resistance.

5. USB apparatus suitable for interconnection with a USB host according to claim 4 wherein said pull-up resistance is at least eight times greater than said pull-down resistance.

6. USB apparatus suitable for interconnection with a USB host according to claim 1 wherein said switch comprises a transistor.

7. USB apparatus suitable for interconnection with a USB host according to claim 1 wherein:

said microcontroller includes a D− bus; and said D− bus of said microcontroller is galvanically coupled to said D− bus of said USB host.

8. USB apparatus suitable for interconnection with a USB host according to claim 1 wherein:

said USB host includes a D+ bus;

said microcontroller includes a D+ bus; and said D+ bus of said microcontroller is galvanically coupled to said D+ bus of said USB host.

9. USB apparatus suitable for interconnection with a USB host according to claim 1 wherein said switch of said USB apparatus is off when said USB apparatus is not connected to said USB host.

10. An embedded system comprising:

a USB host having a D− bus coupled to ground via a pull-down resistance; and

USB apparatus interconnected with said USB host, said USB apparatus comprising:

a microcontroller having a first port and a second port, said first port being coupled via a resistance to a voltage source; and a switch, operated by said microcontroller via said second port, selectably interconnecting said first port and said D− bus of said USB host, when said USB apparatus is connected to said USB host, said microcontroller, when operative in a connection detection mode, being operative to:

supply a predetermined voltage to said second port, thereby closing said switch and thereby interconnecting said first port and said bus of said USB host, when said USB apparatus is connected to said USB host; and monitor a voltage at said first port, which voltage indicates connection of said USB apparatus with said USB host by virtue of a voltage drop at said first port produced by current flow from said first port via said switch and across said pull-down resistance to ground.

11. An embedded system according to claim 10 wherein said USB host does not include a VBUS.

12. An embedded system according to claim 10 wherein a VBUS of said USB host is not connected.

13. An embedded system according to claim 10 wherein said USB host does not employ a standard USB connector.

14. An embedded system according to claim 10 wherein said resistance to a voltage source coupled to said first port functions as a pull-up resistance.

15. An embedded system according to claim 14 wherein said pull-up resistance is at least eight times greater than said pull-down resistance.

16. An embedded system according to claim 10 wherein said switch comprises a transistor.

17. An embedded system according to claim 10 wherein:

said microcontroller includes a D− bus; and said D− bus of said microcontroller is galvanically coupled to said D− bus of said USB host.

18. An embedded system according to claim 10 wherein:

said USB host includes a D+ bus;

said microcontroller includes a D+ bus; and said D+ bus of said microcontroller is galvanically coupled to said D+ bus of said USB host.

19. An embedded system according to claim 10 wherein said switch of said USB apparatus is off when said USB apparatus is not connected to said USB host.

* * * * *